United States Patent [19]
Sands, Jr.

[11] Patent Number: 5,365,194
[45] Date of Patent: Nov. 15, 1994

[54] POWER OPERATIONAL AMPLIFIER HAVING OSCILLATION LIMITER AND METHOD THEREFOR

[75] Inventor: William K. Sands, Jr., Tucson, Ariz.

[73] Assignee: APEX Microtechnology Corporation, Tucson, Ariz.

[21] Appl. No.: 72,329

[22] Filed: Jun. 3, 1993

[51] Int. Cl.[5] .................... H03F 21/00; H03G 1/00; H03G 9/00; H03G 11/00
[52] U.S. Cl. .................... 330/253; 330/255; 330/258; 330/264; 330/269; 327/322; 327/399
[58] Field of Search .............. 330/258, 255, 264, 269, 330/253; 307/590, 592, 593

Primary Examiner—William L. Sikes
Assistant Examiner—Fetsum Abraham
Attorney, Agent, or Firm—Harry M. Weiss

[57] ABSTRACT

An improved power operational amplifier device is disclosed which provides a floating buffer having a first and second RC time constant for controlling a first bank of MOSFET transistors in an output portion of the device. In addition, the power operational amplifier includes a fixed buffer having a third RC time constant for controlling a second bank of MOSFET transistors located in an output portion of the device. A current limit section is coupled to both the floating buffer and the fixed buffer, and, in addition, the current limit section of the improved power operational amplifier has an oscillation stabilizer portion for limiting oscillations of output current during output stage current limit operation. The device also includes an output portion coupled to each of the floating buffer, the fixed buffer, and the current limit section.

20 Claims, 3 Drawing Sheets

POWER OPERATIONAL AMPLIFIER HAVING OSCILLATION LIMITER AND METHOD THEREFOR

FIELD OF THE INVENTION

This invention relates generally to electronic amplification devices and, more specifically, to an improved power operational. amplifier device and method therefor which provides a floating buffer having a first and second RC time constant for controlling a first bank of MOSFET transistors, a fixed buffer having a third RC time constant for controlling a second bank of MOSFET transistors, a current limit section coupled to both the floating buffer and the fixed buffer, and which has an oscillation stabilizer portion for limiting oscillations of output current during current limit operation, and an output portion coupled to each of the floating buffer, the fixed buffer, and the current limit section.

DESCRIPTION OF THE PRIOR ART

In the past, some prior art power operational amplifiers used bipolar junction transistor (BJT) devices in the output stage of the amplifier. This arrangement presents problems when the amplifier operates at high power levels. Of particular note, the BJT devices of these prior art power operational amplifiers have positive temperature coefficients of conductivity at high current levels. This characteristic is undesirable because at high current levels, as the BJT devices tend to heat up due to greater current flow, the combination of the positive temperature coefficients of conductivity and the increased temperature of the BJT devices cause even greater current flow. Naturally, this increase in current flow continues to elevate the temperature of the BJT devices, and if this positive feedback scenario continues to progress, the BJT devices self-destruct. In an effort to circumvent this shortcoming associated with the use of BJT devices in power operational amplifiers, MOSFET transistor devices having negative temperature coefficients of conductivity at high current levels are used in the output stages of the improved power operational amplifier.

The combined use of the MOSFET output stages and the high dissipation capability of the improved power operational amplifier created three fundamental challenges: 1) the possibility of destructive common-mode current in the output stage 2) the output stage presents a very high capacitive load to the second stage, and 3) many high power loads have significant inductance and low resistance, thereby causing severe stability problems during output stage current limit. Therefore, a need existed to provide a power operational amplifier that minimizes the possibility of having destructive common-mode current in the output stage, isolates the high capacitive load presented by the MOSFET output stage from the second stage, and limits output current oscillations during output stage current limit operation caused by the significant inductive impedance of many real world loads.

SUMMARY OF THE INVENTION

In accordance with one embodiment of this invention, it is an object of this invention to provide an improved power operational amplifier device and method therefor.

It is a another object of this invention to provide an improved power operational amplifier device having output stages that prevent second-breakdown phenomenon during periods of high internal dissipation.

It is further object of this invention to provide an improved power operational amplifier device having circuitry for improving stability of the output during periods of output stage current limit.

It is yet another object of this invention to provide an improved power operational amplifier device that limits the possibility of the occurrence of destructive common-mode current in the output stage.

It is still another object of this invention to provide an improved power operational amplifier device that isolates high output stage capacitance from the input staging of the device.

BRIEF DESCRIPTION OF THE PREFERRED EMBODIMENTS

In accordance with one embodiment of this invention, a power operational amplifier device is disclosed comprising in combination, floating buffer means coupled to an input portion of the power operational amplifier device for isolating the input portion from a portion of an output stage of the power operational amplifier device, fixed buffer means coupled to the input portion for isolating the input portion from another portion of the output stage of the power operational amplifier device, current limiting means coupled to both the floating buffer means and the fixed buffer means for limiting output current of the power operational amplifier device, and output stage means coupled to each of the floating buffer means, the fixed buffer means, and the current limiting means for providing the output current of the power operational amplifier device. In addition, the output stage means is provided with a first plurality of MOSFET transistor means coupled to the floating buffer means for delivering positive output current, and a second plurality of MOSFET transistor means coupled to the fixed buffer means for delivering negative output current. The floating buffer means has at least a first MOSFET transistor coupled to a first resistor means for providing a first time constant associated with turning ON the first plurality of MOSFET transistor means. Similarly, the floating buffer means has at least a second MOSFET transistor coupled to a second resistor means for providing a second time constant associated with turning OFF the first plurality of MOSFET transistor means. Also, the floating buffer means has a first biasing means comprising a first MOSFET transistor means coupled to the first MOSFET transistor for adjusting bias of the first MOSFET transistor, and a second biasing means comprising a second MOSFET transistor means coupled to the second MOSFET transistor for adjusting bias of the second MOSFET transistor. In addition, the fixed buffer means has at least a third and a fourth MOSFET transistor coupled to a third resistor means for providing a third time constant associated with turning OFF the second plurality of MOSFET transistor means. Moreover, the current limiting means is provided with oscillation stabilizer means for limiting oscillations of the output current during output stage current limit operation.

In accordance with another embodiment of this invention, a method of providing a power operational amplifier device is provided comprising the steps of providing floating buffer means coupled to an input portion of the power operational amplifier device for isolating the input portion from a portion of an output stage of the power operational amplifier device, providing fixed buffer means coupled to the input portion for isolating the input portion from another portion of the output stage of the power operational amplifier device, providing current limiting means coupled to both the floating buffer means and the fixed buffer means for limiting output current of the power operational amplifier device, and providing output stage means coupled to each of the floating buffer means, the fixed buffer means, and the current limiting means for providing the output current of the power operational amplifier device. In addition, this method involves the step of providing the output stage means with a first plurality of MOSFET transistor means coupled to the floating buffer means for delivering positive output current, and with a second plurality of MOSFET transistor means coupled to the fixed buffer means for delivering negative output current. Also, this method includes the step of providing the floating buffer means with at least a first MOSFET transistor coupled to a first resistor means for providing a first time constant associated with turning ON the first plurality of MOSFET transistor means. Similarly, the floating buffer means has at least a second MOSFET transistor coupled to a second resistor means for providing a second time constant associated with turning OFF the first plurality of MOSFET transistor means. Moreover, this method includes the step of providing the floating buffer means with a first biasing means comprising a first MOSFET transistor means coupled to the first MOSFET transistor for adjusting bias of the first MOSFET transistor, and with a second biasing means comprising a second MOSFET transistor means coupled to the second MOSFET transistor for adjusting bias of the second MOSFET transistor. In addition, this method contains the step of providing the fixed buffer means with at least a third and a fourth MOSFET transistor coupled to a third resistor means for providing a third time constant associated with turning OFF the second plurality of MOSFET transistor means. Moreover, this method includes the step of providing the current limiting means with oscillation stabilizer means for limiting oscillations of the output current during output stage current limit operation.

The forgoing and other objects, features, and advantages of the invention will be apparent from the following, more particular, description of the preferred embodiments of the invention, as illustrated in the accompanying drawings.

DESCRIPTION OF THE PREFERRED EMBODIMENT

Figure 1:
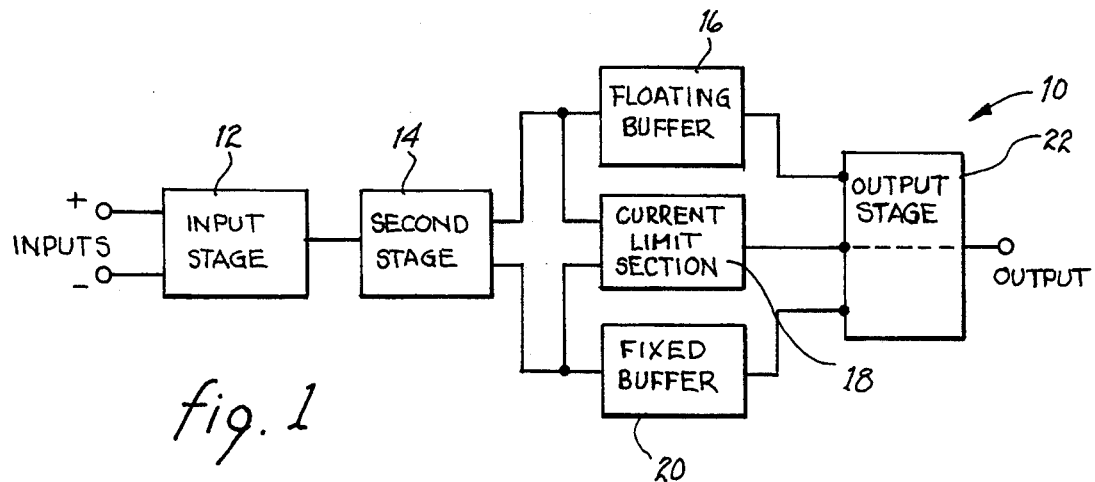
FIG. 1 is a simplified block diagram of the improved power operational amplifier device.

Referring to FIG. 1, an improved power operational amplifier is generally designated by reference number 10. An input stage 12 is coupled to a positive and a negative input for developing an output signal proportional to the difference between the input signals. The input stage 12 is coupled to a second stage 14 which further amplifies the signal input to the second stage. The output of the second stage 14 is coupled to each of the floating buffer 16, the fixed buffer 20, and the current limit section 18. The output from each of the floating buffer 16, the fixed buffer 20, and the current limit section 18 is coupled to the output stage 22 of the device 10.

Figure 2:
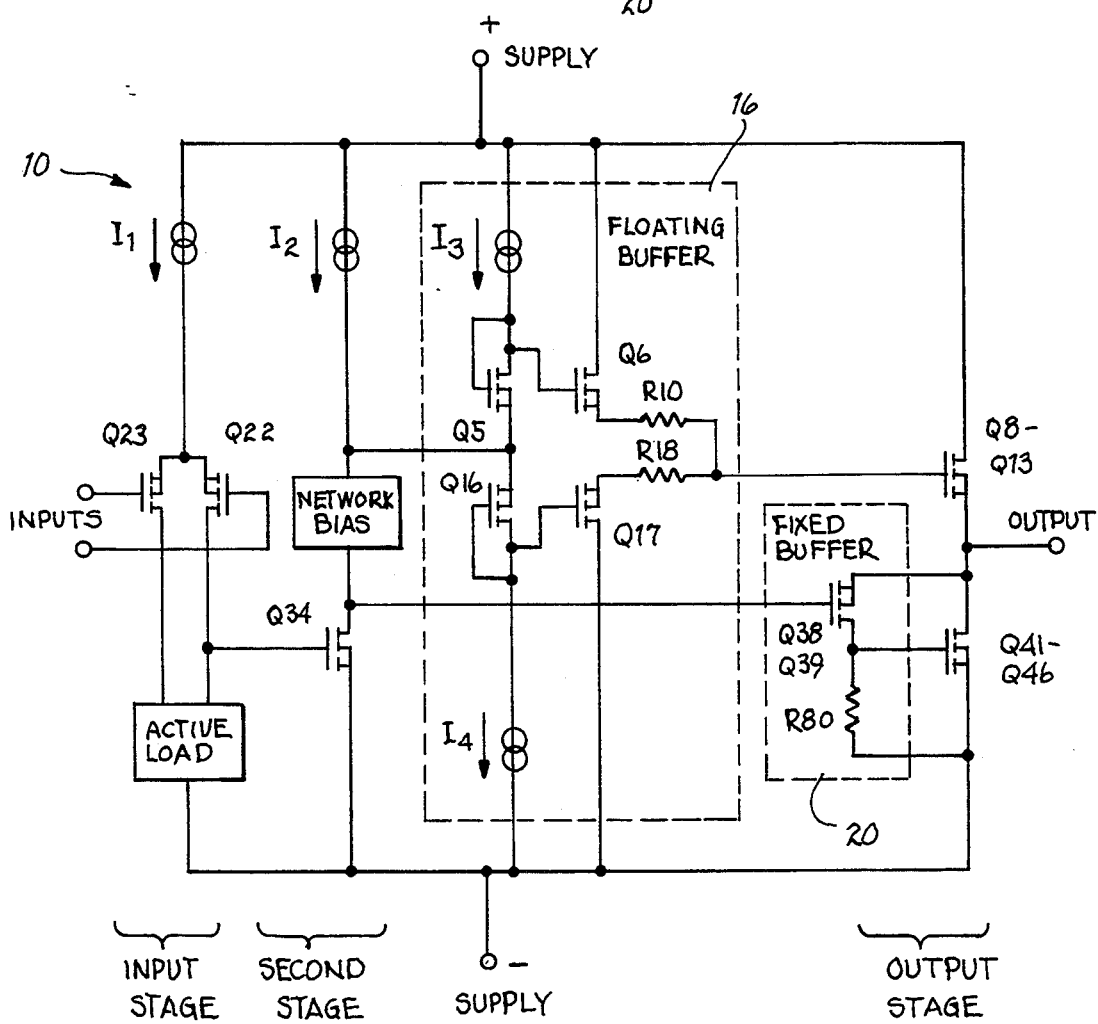
FIG. 2 is a simplified electrical schematic diagram of a portion of the improved power operational amplifier device.

Referring to FIG. 2, a portion of the power operational amplifier 10 is shown including the input stage 12, the second stage 14, the floating buffer 16, the fixed buffer 20, and a portion of the output stage 22. Note that the current limit section 22 is not shown here, however, the current limit section 22 is presented in FIG. 7. A common node between each of the input stage 12, the second stage 14, the floating buffer 16, and a portion of the output stage 22 is coupled to a positive power supply for the device 10. Similarly, a negative power supply for the device 10 is coupled to a common node between each of the input stage 12, the second stage 14, the floating buffer 16, the fixed buffer 20, and a portion of the output stage 22. The input stage 12 provides a differential amplifier having an active load and a current source represented by I1 which supplies the differential configuration of MOSFET devices Q22 and Q23 with operating current. The active load of the input stage 12 provides an active current mirror load for Q22 and Q23. Such an active current mirror load may include a current mirror arrangement of NPN transistors. The output of the input stage 12 is coupled to the second stage 14 at the gate junction of MOSFET device Q34 which has a current source active load represented by I2. Note that a network bias portion is series connected between the MOSFET device Q34 and the current source active load I2 to provide a small amount of class AB bias to portions of the output stage 22. This class AB bias current flows in one portion of the output stage 22 through MOSFET devices Q8–Q13, and in another portion of the device 10, namely through MOSFET devices Q38 and Q39. By providing this class AB bias, a portion of the output stage 22 is provided with a relatively small amount of current during inactive periods so that when a portion of the output stage 22, such as the MOSFET devices Q8–Q13, begins to carry the output load, it is "warmed up" in order to deliver optimum output current to the load. If desired, a similar type of arrangement of the improved power operational amplifier device 10 could provide the MOSFET devices Q41–Q46 with a small amount of current during inactive periods so that when these devices begin to carry the output load, they are also "warmed up" in order to deliver the best possible output current.

The output of the second stage 14 is coupled to each of the floating buffer 16, the current limit section 18 which is not shown in this Figure, and the fixed buffer 20. The combination of the floating buffer 16 and the fixed buffer 20 help to solve two of the three previously discussed challenges for the power operational amplifier device 10, namely the possibility of destructive common-mode current in the output stage and the existence of a very high capacitive load to the second stage due to the MOSFET devices Q8–Q13 and Q41–Q46 of the output stage 22.

Again referring to FIG. 2, the floating buffer 16 has MOSFET devices Q6 and Q17 configured as source followers having class AB bias. This bias is provided by the voltage drop across MOSFET devices Q5 and Q16 due to the current flow through Q5 and Q16 from current sources I3 and I4, respectively. The common source junction between Q5 and Q16 is an input node for the floating buffer 16, and the common junction between resistors R10 and R18 is an output node. The high voltage compliance of current sources I3 and I4 allow the floating buffer 16 to operate with its input and output nodes at voltage levels approximately between the voltage levels of the positive and the negative voltage power supplies to the floating buffer 16. The high input impedance and voltage follower action of the floating buffer 16 isolates the large capacitance of the MOSFET devices Q8–Q13 relative to the second stage 14 of the power operational amplifier device 10.

The MOSFET devices Q38 and Q39, as shown in FIG. 2, in conjunction with the resistor R80 form the fixed buffer 20. This voltage follower configuration of the fixed buffer 20 has an input to the gate junction and an output from the drain junction of each of Q38 and Q39. The high input impedance and voltage follower action of the fixed buffer 20 isolates the large capacitance of the MOSFET devices Q41–Q46 relative to the second stage 14 of the power operational amplifier device 10.

The complimentary operation of the floating buffer 16 and the fixed buffer 20 helps to prevent the occurrence of both Q8–Q13 and Q41–Q46 carrying the output load simultaneously, or in other words, common mode output stage conduction. The output stage 22 is quasi-complementary with at least a first and second bank of same polarity, such as N-channel, output devices. A first bank of output devices comprises MOSFET devices Q8–Q13 and a second bank of output devices comprises MOSFET devices Q41–Q46. MOSFET devices Q8–Q13 provide positive load current while MOSFET devices Q41–Q46 provide negative load current. It would be highly undesirable to have the first bank of output devices Q8–Q13 and the second bank of output devices Q41–Q46 conducting concurrently. This action would cause a relatively large and destructive current to flow from the positive power supply through MOSFET devices Q8–Q13, Q41–Q46, and then to the negative power supply. Consequently, when the power operational amplifier device 10 generates a rapid change in output voltage polarity, it is imperative that during the transition of polarity, MOSFET devices Q8–Q13 and Q41–Q46 are not ON at the same time. This feature of the power operational amplifier device 10 is accomplished in the following manner:

Transition from Positive to Negative Output

1) Q8–Q13 are ON. Q41–Q46 are OFF.
2) The second stage 14 output voltage executes a positive to negative transition.
3) The combination of Q17 and R18 in the floating buffer 16 discharges the gate capacitance of Q8–Q13, thereby turning Q8–Q13 OFF.
4) Q38 and Q39 charge the gate capacitance of Q41–46, thereby turning Q41–Q46 ON.
5) The resistance-capacitance (RC) time constant associated with R18 and Q8–Q13 causes #3 to occur more rapidly than #4, thus preventing common mode conduction.

Transition from Negative to Positive Output

1) Q41–Q46 are ON. Q8–Q13 are OFF.
2) The second stage 14 output voltage executes a negative to positive transition.
3) Q6 and R10 charge the gate capacitance of Q8–Q13, thereby turning Q8–Q13 ON.
4) R80 discharges the gate capacitance of Q41–Q46, thereby turning Q41–Q46 OFF.
5) The RC time constant associated with R10 and Q8–Q13 relative to the RC time constant associated with R80 and Q41–Q46 causes #3 to occur more slowly than #4, thus preventing common mode conduction.

Figure 3:
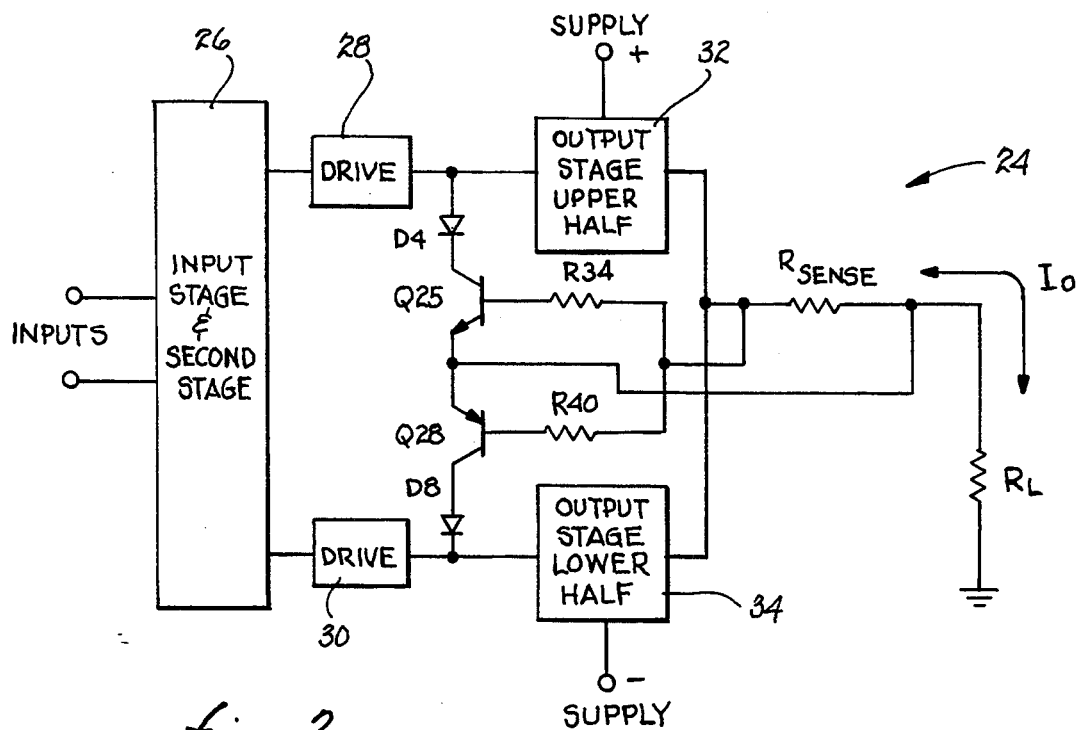
FIG. 3 is a simplified electrical diagram showing a prior art power operational amplifier driving a resistive load.

Referring to FIG. 3, a simplified electrical diagram depicts a prior art power operational amplifier 24. The prior art device 24 has combined input stage and second stage 26 with a plurality of inputs. The input portion of a pair of drivers 28 and coupled to the combined input stage and second stage 26. The driver 28 is also coupled to the diode D4 and to the output stage upper half 32. Similarly, the driver 30 is coupled to the diode D8 and to the output stage lower half 34. An NPN transistor Q25 is coupled to the diode D4 at its collector junction while the emitter junction of transistor Q25 is coupled to an emitter junction of a PNP transistor Q28. The base junction of each of Q25 and Q28 is coupled to a node of a resistor R34 and R40, respectively. The collector junction of Q28 is connected to a junction of the diode D8. The resistors R34 and R40 are connected together at one node of another resistor Rsense. The output current Io of the device 24 is delivered to a load which is modeled as a resistor RL. The current limit feature of this prior art operational amplifier device 24 is achieved with devices that turn ON, such as Q25 and Q28, when excessive output current is sensed via Rsense. More specifically, when Io reaches a preselected value, the voltage drop across Rsense becomes large enough to turn on Q25. The diode D4 will begin to conduct and divert current from its normal path into the input of the output stage upper half 32, thereby limiting the positive output current to a non-destructive level. Similarly, the components Rsense, R40, Q28, and D8 work together to limit excessive negative output current Io.

Figure 4:
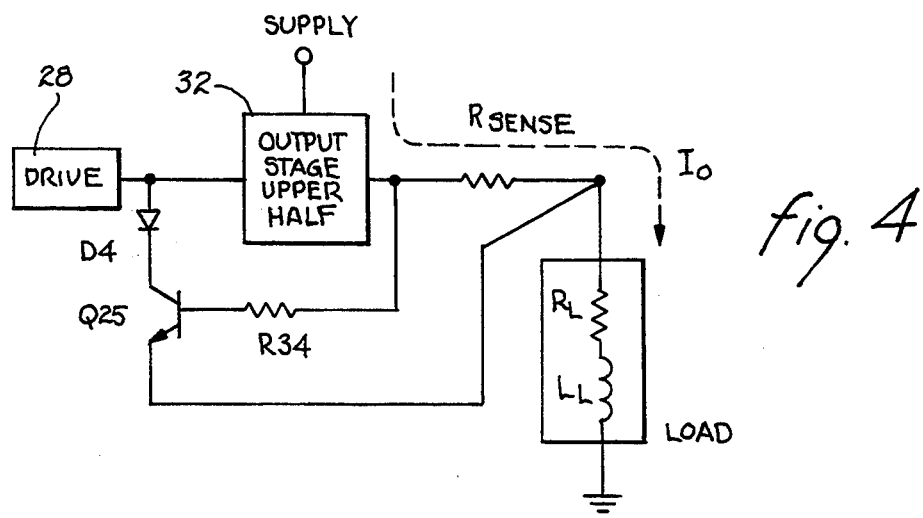
FIG. 4 is a simplified electrical diagram showing a portion of the prior art power operational amplifier of FIG. 3 driving a load having resistive and inductive components.
Figure 5:
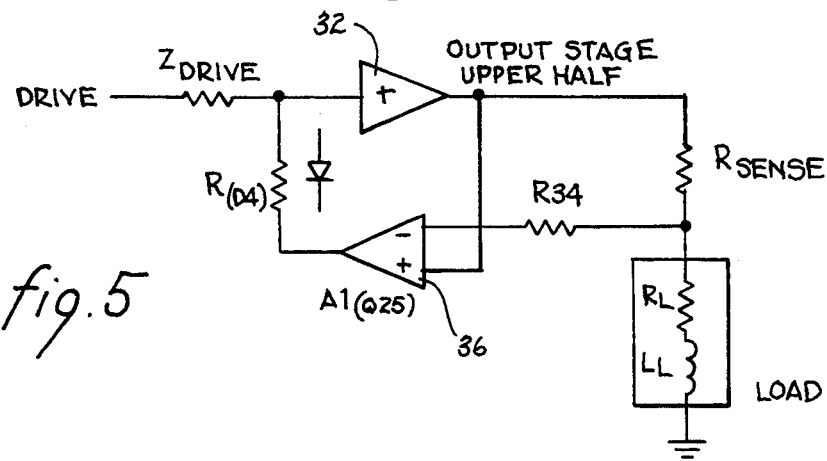
FIG. 5 is a simplified electrical diagram representing the prior art power operational amplifier of FIG. 4.
Figure 6:
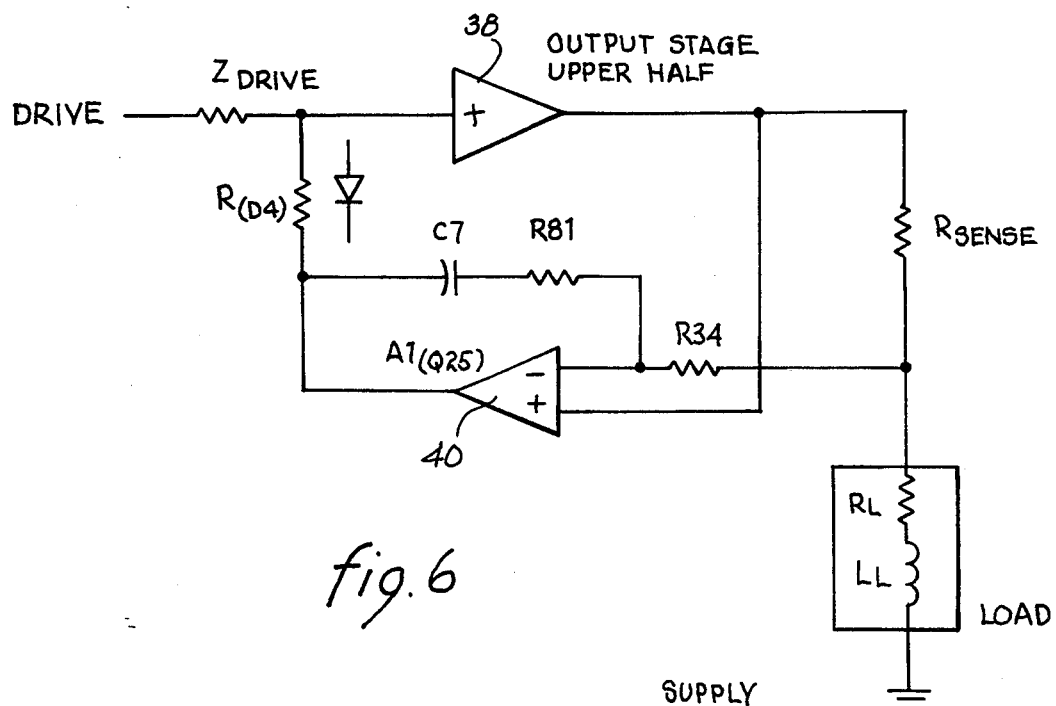
FIG. 6 is a simplified electrical diagram of a portion of the simplified electrical schematic diagram of FIG. 7.
Figure 7:
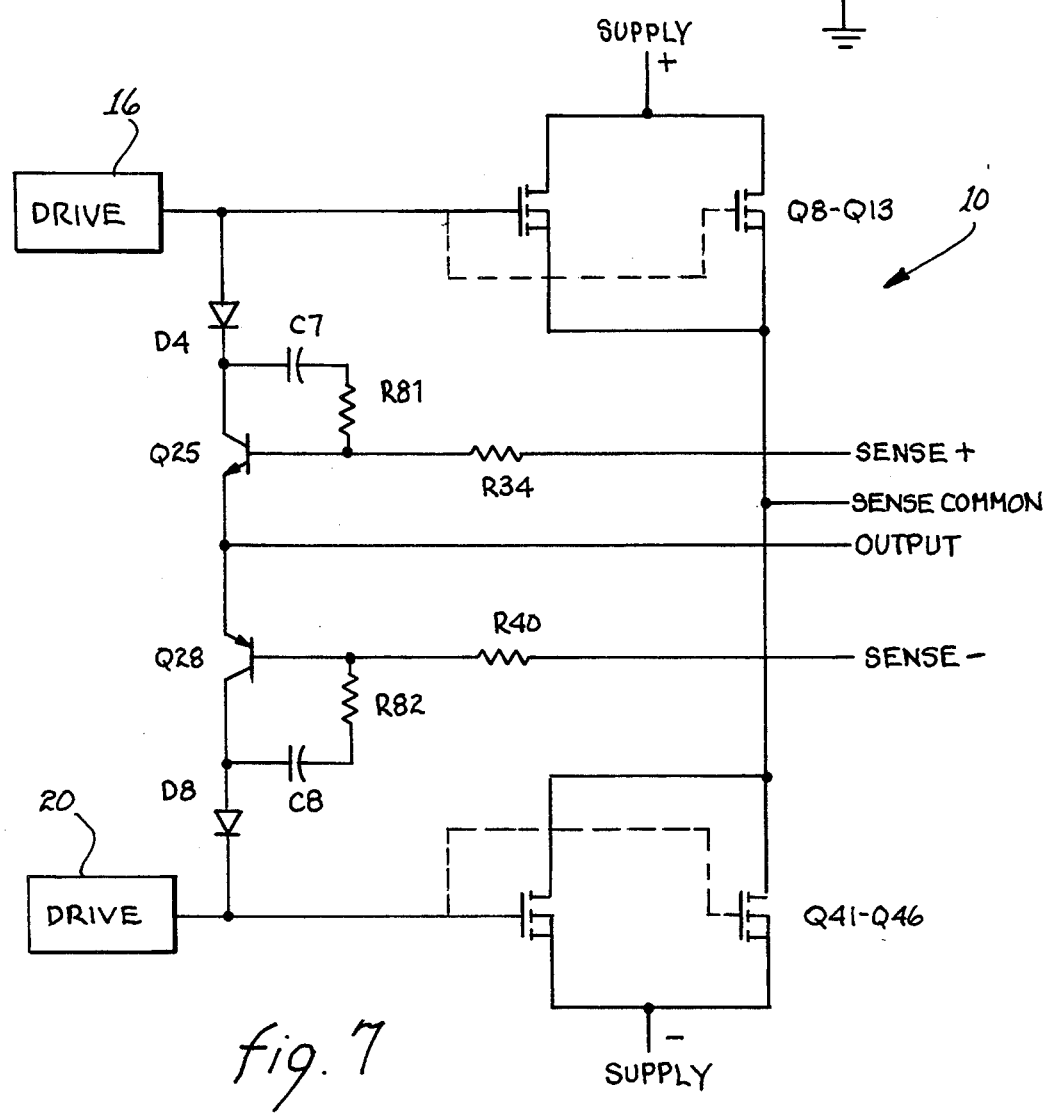
FIG. 7 is a simplified electrical schematic diagram of a portion of the improved power operational amplifier device showing the oscillation limiting portion of the current limit section of the device.

Referring to FIGS. 4–6, a portion of the prior art operational amplifier device 24 of FIG. 3 is shown in FIGS. 4 and 5. Of particular interest in FIGS. 4–6, the load is more realistically represented as a resistor RL and an inductor LL since many real world loads have both real and inductive impedance. Note that during the current limiting operation of the prior art device 24, the transistor Q25 and the diode D4 are ON in order to limit the output current Io, and the configuration of device 24 as shown in FIG. 4 can be simplified to the conceptual diagram shown in FIG. 5. In this instance, a negative feedback loop exists for the inverting gain block 36 shown in FIG. 5. If the phase shift associated with the load RL and LL is sufficient, the output of this system will oscillate. A novel approach to solving this oscillation problem is shown in the simplified electrical diagram of FIG. 6 which represents a portion of the improved power operational amplifier 10. In FIG. 6, the output stage upper half 38 is analogous to the first bank of MOSFET devices Q8–Q13 shown in FIG. 7, furthermore, the A1(Q25) element 40 of FIG. 6 represents the NPN transistor Q25 as shown in FIG. 7. The addition of the resistive-capacitive filter R81 and C7 to the improved power operational amplifier device 10 provides frequency and phase compensation for A1(Q25) to limit the output current oscillations during output stage current limit which are due to the phase shift associated with typical combinations of RL and LL found in real world loads. This solution is also unique with respect to the placement of C7 and R81 to D4. When the improved power operational amplifier device 10 is not in current limit, the diode D4 is OFF, and C7 and R81 present no loading effects on the drive of the device 10. When the device 10 enters current limit, the diode D4 is ON, and C7 and R81 are coupled along with A1(Q25) in order to frequency and phase compensate the output of the device 10.

Referring to FIGS. 2 and 7, it is important to understand that the improved power operational amplifier 10 comprises certain features, in combination, that are presented in both of these Figures, however, this is not meant to imply that the improved power operational amplifier 10 is limited to the specific configuration depicted in FIGS. 2 and 7. In FIG. 7, the drive elements 16 and 20 are the same as the floating buffer 16 and the fixed buffer 20 of FIG. 2. Also, the first and second banks of MOSFET devices Q8–Q13 and Q41–Q46 shown in FIG. 7 are the same as the devices Q8–Q13 and Q41–Q46 shown in FIG. 2. The remaining elements shown in FIG. 7, namely the diodes D4 and D8, the NPN transistor Q25, the PNP transistor Q28, the capacitors C7 and C8, and the resistors R81, R82, R34, and R40 define the current limit section 18 of the improved power operational amplifier device 10 of FIG. 1. These elements of the current limit section 18 are shown in FIG. 7 instead of in FIG. 2 in an effort to separate the different elements and features of the device 10 into two Figures, thereby simplifying the presentation of this complex device 10.

Now focusing on the current limit section 18 of FIG. 7, a first junction of the diode D4 is coupled to the output of the floating buffer 16 while the other junction of the diode D4 is coupled to a capacitor C7 and to the collector junction of the NPN transistor Q25. The junction between the emitter of the NPN transistor Q25 and the emitter of the PNP transistor Q28 defines the OUTPUT of the device 10 which delivers current to the output load. The SENSE+ line is coupled to a first node of the resistor R34 such that when the output current reaches a maximum allowable value, the voltage drop across R34 turns ON Q25, thereby limiting the output current. The series connection of the resistor R81 and the capacitor C7 across the emitter and the base junction of the transistor Q25 limits oscillation of the output current during the current limit operation of the improved power operational amplifier device 10. As the elements D4, Q25, R34, R81 and C7 serve to limit both the maximum magnitude and the oscillation of the positive output current during positive current limit operation of the device 10, the elements D8, Q28, R40, R82, and C8 in conjunction with the SENSE- signal help to limit both the maximum magnitude and the oscillation of the negative output current during negative current limit operation of the device 10. The SENSE COMMON line is coupled between the first and second bank of output MOSFET devices Q8–Q13 and Q41–Q46, respectively.

OPERATION

Referring to FIG. 1, the input stage 12 forms a differential amplification between a first and second input. The differential output from the input stage 12 is then further amplified by the second stage 14. The output of the second stage 14 is coupled to each of the floating buffer 16, the current limit section 18, and the fixed buffer 20. The floating buffer 16 and the fixed buffer 20, each having significant input impedance, isolate the second stage 14 from the large capacitance of the output banks of MOSFET devices Q8–Q13 and Q41–Q46. In addition, both the floating buffer 16 and the fixed buffer 20 provide approximately unity gain. Positive, static output current is supplied via the floating buffer 16 and the first bank of output MOSFET devices Q8–Q13, and negative, static output current is supplied via the fixed buffer 20 and the second bank of output MOSFET devices Q41–Q46. In the case of positively changing output current, the floating buffer 16 and the first bank of output MOSFET devices Q8–Q13 either increase the magnitude of a positive output current or reduce the magnitude of a negative output current. In the alternative, when the output current changes in the negative direction, the fixed buffer 20 and the second bank of output MOSFET devices Q41–Q46 either decrease the magnitude of a positive output current or increase the magnitude of a negative output current.

While the invention has been particularly shown and described with reference to the preferred embodiments thereof, it will be understood by those skilled in the art that the foregoing and other changes in form and details may be made therein without departing from the spirit and scope of the invention. For example, temperature measuring circuitry, temperature reporting circuitry, manual shutdown circuitry, automatic shutdown circuitry for excessive temperature cases, and other protective circuitry could be integrated into the improved power operational amplifier device 10 if desired.

I claim:

1. In a power operational amplifier device, the combination comprising:
    floating buffer means coupled to an input portion of said power operational amplifier device for isolating said input portion from a portion of an output stage of said power operational amplifier device;
    fixed buffer means coupled to said input portion for isolating said input portion from another portion of said output stage of said power operational amplifier device;
    current limiting means coupled to both said floating buffer means and said fixed buffer means for limiting output current of said power operational amplifier device; and
    output stage means coupled to each of said floating buffer means, said fixed buffer means, and said current limiting means for providing said output current of said power operational amplifier device.

2. The device of claim 1 wherein said output stage means is provided with a first plurality of MOSFET transistor means coupled to said floating buffer means for delivering positive output current.

3. The device of claim 2 wherein said floating buffer means having at least a first MOSFET transistor coupled to a first resistor means for providing a first time constant associated with turning ON said first plurality of MOSFET transistor means.

4. The device of claim 3 wherein said floating buffer means having at least a second MOSFET transistor coupled to a second resistor means for providing a second time constant associated with turning OFF said first plurality of MOSFET transistor means.

5. The device of claim 4 wherein said floating buffer means having a second biasing means comprising a second MOSFET transistor means coupled to said second MOSFET transistor for adjusting bias of said second MOSFET transistor.

6. The device of claim 3 wherein said floating buffer means having a first biasing means comprising a first MOSFET transistor means coupled to said first MOSFET transistor for adjusting bias of said first MOSFET transistor.

7. The device of claim 1 wherein said output stage means is provided with a second plurality of MOSFET transistor means coupled to said fixed buffer means for delivering negative output current.

8. The device of claim 7 wherein said fixed buffer means having at least a third and a fourth MOSFET transistor coupled to a third resistor means for providing a third time constant associated with turning OFF said second plurality of MOSFET transistor means.

9. The device of claim 1 wherein said current limiting means comprising at least a diode coupled to a junction of a transistor having a load sensing resistor coupled thereto for controlling said transistor.

10. The device of claim 9 wherein said transistor of said current limiting means is provided with oscillation stabilizer means for limiting oscillations of said output current.

11. A method of providing in a power operational amplifier device the combination comprising the steps of:
providing floating buffer means coupled to an input portion of said power operational amplifier device for isolating said input portion from a portion of an output stage of said power operational amplifier device;
providing fixed buffer means coupled to said input portion for isolating said input portion from another portion of said output stage of said power operational amplifier device;
providing current limiting means coupled to both said floating buffer means and said fixed buffer means for limiting output current of said power operational amplifier device; and
providing output stage means coupled to each of said floating buffer means, said fixed buffer means, and said current limiting means for providing said output current of said power operational amplifier device.

12. The method of claim 11 wherein said output stage means is provided with a first plurality of MOSFET transistor means coupled to said floating buffer means for delivering positive output current.

13. The method of claim 12 wherein said floating buffer means having at least a first MOSFET transistor coupled to a first resistor means for providing a first time constant associated with turning ON said first plurality of MOSFET transistor means.

14. The method of claim 13 wherein said floating buffer means having at least a second MOSFET transistor coupled to a second resistor means for providing a second time constant associated with turning OFF said first plurality of MOSFET transistor means.

15. The method of claim 14 wherein said floating buffer means having a second biasing means comprising a second MOSFET transistor means coupled to said second MOSFET transistor for adjusting bias of said second MOSFET transistor.

16. The method of claim 13 wherein said floating buffer means having a first biasing means comprising a first MOSFET transistor means coupled to said first MOSFET transistor for adjusting bias of said first MOSFET transistor.

17. The method of claim 11 wherein said output stage means is provided with a second plurality of MOSFET transistor means coupled to said fixed buffer means for delivering negative output current.

18. The method of claim 17 wherein said fixed buffer means having at least a third and a fourth MOSFET transistor coupled to a third resistor means for providing a third time constant associated with turning OFF said second plurality of MOSFET transistor means.

19. The method of claim 11 wherein said current limiting means comprising at least a diode coupled to a junction of a transistor having a load sensing resistor coupled thereto for controlling said transistor.

20. The method of claim 19 wherein said transistor of said current limiting means is provided with oscillation stabilizer means for limiting oscillations of said output current.

* * * * *